United States Patent [19]

Strain

[11] Patent Number: 4,603,471
[45] Date of Patent: Aug. 5, 1986

[54] METHOD FOR MAKING A CMOS CIRCUIT HAVING A REDUCED TENDENCY TO LATCH BY CONTROLLING THE BAND-GAP OF SOURCE AND DRAIN REGIONS

[75] Inventor: Robert J. Strain, San Jose, Calif.

[73] Assignee: Fairchild Semiconductor Corporation, Cupertino, Calif.

[21] Appl. No.: 647,743

[22] Filed: Sep. 6, 1984

[51] Int. Cl.⁴ .................. H01L 21/425; H01L 21/265
[52] U.S. Cl. ..................... 29/576 B; 29/571; 29/576 T; 148/1.5; 148/187; 148/DIG. 61; 357/23.13; 357/91
[58] Field of Search .............. 148/1.5, 187; 29/576 B, 29/571 I, 576 T; 357/23, 91

[56] References Cited

U.S. PATENT DOCUMENTS 3,796,929  3/1974  Nicholas et al. ............... 148/1.5
4,111,719  9/1978  Mader et al. ................... 148/1.5
4,498,224  2/1985  Maeguchi ......................... 29/571
4,511,408  4/1985  Holonyak, Jr. ................. 148/1.5

OTHER PUBLICATIONS

Yoshihiro et al., in Ion-Implantation in Semiconductors, ed. S. Namba, Plenum, N.Y. 1974, p. 571.
Stephen et al., Ibid, p. 619.
Nomura et al., Ibid, p. 681.

Primary Examiner—Upendra Roy
Attorney, Agent, or Firm—Burns, Doane, Swecker & Mathis

[57] ABSTRACT

The tendency of a CMOS circuit to latch up is reduced by implanting ions of germanium or tin into the source and drain regions of the circuit. The low energy gap of these ions lowers the band gap of the source and drain regions, which in turn inhibits their ability to inject carriers into the substrate and well.

6 Claims, 5 Drawing Figures

U.S. Patent     Aug. 5, 1986     4,603,471
Fig. 1
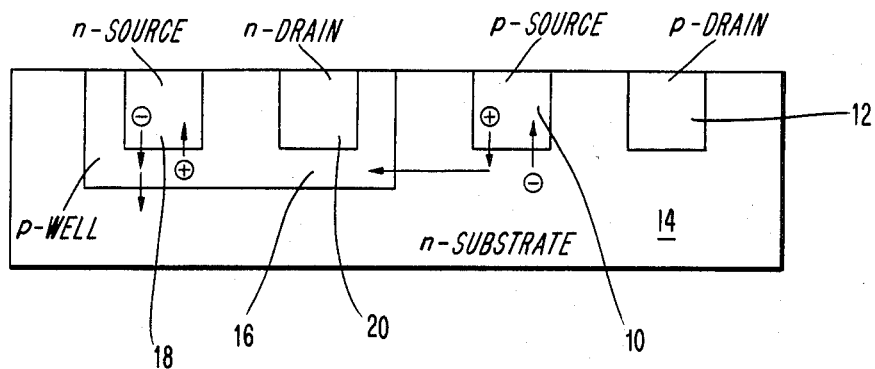
Fig. 2A
Fig. 2B
Fig. 3A
Fig. 3B
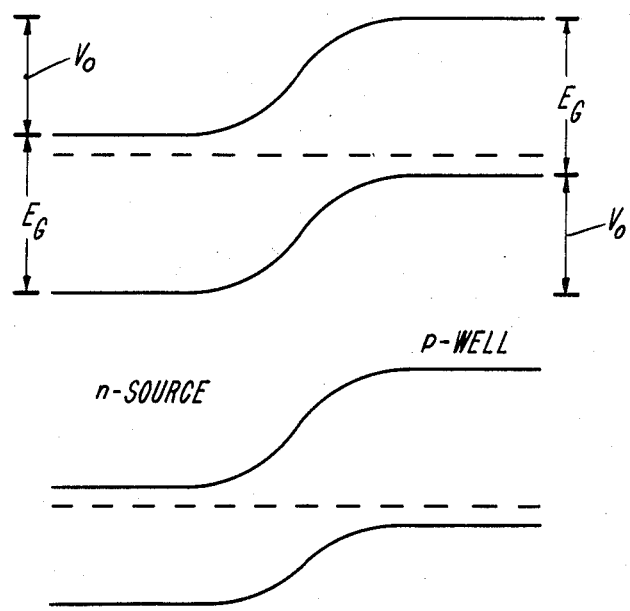
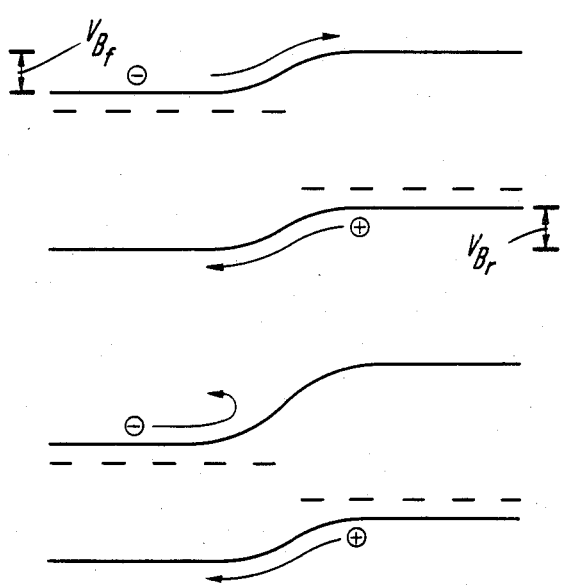

METHOD FOR MAKING A CMOS CIRCUIT HAVING A REDUCED TENDENCY TO LATCH BY CONTROLLING THE BAND-GAP OF SOURCE AND DRAIN REGIONS

BACKGROUND OF THE INVENTION

The present invention is directed to complementary metal-oxide-semiconductor (CMOS) circuits, and more particularly to a method for reducing the characteristic tendency of such circuits to latch up.

A conventional CMOS circuit can have the general construction illustrated in FIG. 1. Basically, it comprises a PMOS transistor having a p-source 10 and a p-drain 12 formed in an n-substrate 14. In addition, a p-type well or tub 16 is provided in the substrate. An n-source 18 and an n-drain 20 are formed in the well to provide a complementary NMOS transistor. Of course, it will be appreciated that the CMOS circuit can have the opposite configuration, in which an NMOS transistor is formed in a p-substrate and a PMOS transistor is located in an n-well disposed on the substrate.

Examination of the structure depicted in FIG. 1 reveals that it inherently includes two integrated bipolar transistors. One of these is a vertical n-p-n transistor formed by the source and drain 18 and 20 of the NMOS transistor, the p-well 16 and the n-substrate 14. In addition, a lateral p-n-p transistor is provided by the p-well 16, the n-substrate 14 and the p-type source and drain regions 10 and 12. These two integrted transistors essentially constitute a four layer p-n-p-n device that can latch up and hold itself on under certain conditions.

More particularly, the flow of current in a bipolar transistor basically involves a flow of carriers in two opposite directions across a p-n junction. For example, in the vertical n-p-n transistor formed by the source 18 and drain 20, the well 16 and the substrate 14, the source 18 functions as the emitter and the well 16 functions as the base of the bipolar transistor. Under suitable forward biasing conditions electrons flow from the source 18 into the well 16 simultaneously with the flow of holes from the well 16 into the source 18. Since the p-well typically exhibits a long minority carrier lifetime, the electrons which are injected into it from the source 18 can be sustained by low p-well currents, and enter into the substrate 14 (which acts as a collector). Similarly, in the lateral p-n-p transistor, the source 10 functions as an emitter and the substrate 14 acts as a base. When suitably biased, holes are injected from the source 10 into the substrate 14 as electrons are contributed to the source from the substrate. These holes can be minority carriers which are collected by the well 16. Under appropriate conditions, this bidirectional injection of carriers across the junction of the substrate 14 and the well 16 can result in the four layer device becoming latched and holding itself on.

In the past, some attempts at reducing or eliminating the latch-up tendency involved the use of thick wells or buried layers, or the placement of a guard ring around the NMOS transistor to isolate it from the PMOS transistor. Other attempts focussed on reducing unexpected potential drops with epitaxial subtrates or providing diffusions to intercept injected carriers. However, each of these approaches is undesirable in that it requires additional space for the extra structures and therefore results in an increase in the overall size of the devices.

OBJECTS AND BRIEF STATEMENT OF THE INVENTION

It is an object of the present invention to reduce the tendency of CMOS circuits to latch up a means of a technique which does not require any additional layout space over that allocated to the basic circuit.

It is another object of the invention to provide such a technique that can be easily implemented without unnecessarily complicating the fabrication of the circuit.

In accordance with the present invention, these objects and their attendent advantages are achieved with the use of ion implantation techniques to reduce the energy gap of the source and drain regions, to thereby inhibit their ability to inject carriers. For example, if the CMOS circuit is formed on a silicon substrate, the energy gap of each of the source and drain regions can be reduced by implanting ions of a material such as germanium or tin, either of which has a lower energy gap than silicon. The resultant modification of the energy gap for the source and drain regions reduces their ability to forwardly inject carriers into the substrate or well, without affecting ability of the sources and drain to fill their roles in the desired field effect transistor. Each 60 meV reduction of the energy gap for the source and drain should reduce the density of the forwardly injected, parasitic carriers by an order of magnitude.

Further features of the present invention will be appreciated from the following detailed description of preferred embodiments, with reference to the accompanying drawings.

BRIEF DESCRIPTION OF THE DRAWINGS

FIG. 1 is a cross-sectional side view of the basic structure of a CMOS circuit;

FIGS. 2A and 2B are energy band diagrams of a conventional p-n junction in an unbiased and a forwardly biased state, respectively; and FIGS. 3A and 3B are energy band diagrams of an unbiased and forwardly biased p-n junction that is modified in accordance with the present invention.

DESCRIPTION OF THE ILLUSTRATED EMBODIMENT

For purposes of discussion, the principles of the present invention are described hereinafter with specific reference to the CMOS structure illustrated in FIG. 1. However, it will be appreciated by those having familiarity with this technology that the practical applications of the invention are not so limited. Rather, it is applicable to all types of CMOS circuits, including those in which the PMOS transistor is formed in an n-well located on a p-substrate.

The principles underlying the present invention are best explained with reference to FIGS. 2 and 3. Referring first to FIG. 2A, the energy band diagram for a conventional p-n junction is illustrated for the case in which the junction is unbiased. By conventional is meant that the energy gaps for each of the p-type and n-type regions have not been modified and are therefore approximately equal to one another. For example, if each of these two regions are formed by appropriately doped silicon, the energy gap of each would be approximately 1.1 electron volts. When the junction is in equilibrium, i.e., no electrical bias is applied to it, a junction barrier potential $V_o$ is inherently formed. This potential is equal to the difference between the conduction band energy levels for the n- and p-type materials, and presents a barrier to the flow of electrons from the n-type material (e.g., source) into the p-type material (e.g., well). A similar such barrier is presented for the flow of holes from the well into the source by virtue of the difference between the valance band energy levels for the two regions.

FIG. 2B illustrates the situation in which the junction is forwardly biased. The effect of forward biasing is to reduce the magnitude of the junction barrier potential and thereby "flatten" the curve between the energy levels for the two regions. A barrier potential $V_{Bf}$ for forward injection of electrons from the source into the well is equal to the junction potential $V_o$ diminished by the magnitude of the biasing voltage. This barrier is small enough to enable the electrons to more easily flow from the source into the well.

Similarly, the barrier potential $V_{Br}$ for the flow of holes from the well into the source is reduced, thus enabling reverse injection of these carriers to take place. The two barrier potentials $V_{Bf}$ and $V_{Br}$ are approximately equal.

As noted previously, the forward injection of minority carriers from the n-source into the p-well, as well as from the p-source into the n-substrate, can contribute to a bidirectional flow of carriers between the well and the substrate that causes the CMOS circuit to latch up under appropriate conditions. In accordance with the present invention, this tendency of the circuit to latch up is reduced by inhibiting the ability of the sources to inject carriers into the well and substrate, respectively. This inhibition is provided by reducing the energy gaps of the sources relative to the energy gaps of the well and the substrate. The effect of such a reduction is illustrated in FIGS. 3A and 3B.

When the energy gap of the source is reduced, the barrier potential $V_{Bf}$ for the flow of electrons from the n-source to the p-well is greater than the barrier $V_{Br}$ for the flow of holes from the well to the source, as shown in FIG. 3A. When a given forward bias is applied to the junction, as illustrated with respect to FIG. 3B, the smaller barrier $V_{Br}$ will be reduced by an amount sufficient to enable holes to easily flow from well to source. This hole current will be high enough to clamp off the bipolar device and, in combination with the greater forward barrier potential $V_{Bf}$, will thereby inhibit the flow of electrons from source to well. Consequently, the forward injection of carriers will be inhibited relative to reverse injection, even under bias conditions normally associated with latch-up. A similar occurrance takes place with respect to the p-source and the n-substrate in the PMOS transistor. With the reduction of the forward injection of carriers from the sources into the well and the substrate, the ability of the circuit to latch up will be diminished.

The particular manner in which the energy gaps of the source regions are reduced is through ion implantation of a material having an energy gap which is less than the energy gap of the substrate material in which the circuit is formed. Thus, if the CMOS circuit is formed on a silicon substrate, ions of a material such as germanium or tin (which have lower energy gaps than silicon) can be implanted into the source regions to decrease their energy gaps.

The concentration of lower energy gap ions that are to be implanted into the source regions is dependent upon the amount by which it is desired to decrease the forward injection of carriers from the sources. It is estimated that the flow of carriers under forward injection will be reduced by an order of magnitude for each decrease of about 60 meV in the energy gap. A total energy gap change of about 120 meV, to reduce forward carrier injection 100 fold, will probably be practical in most cases.

The dose of ions to be implanted to achieve such an energy gap reduction is determined by interpolation between the energy gaps of the semiconductor and modifying materials, with reference to the desired energy gap. For example, if ions of germanium (having an energy gap of 0.82 ev) are to be implanted into a silicon substrate (which has an energy gap of 1.15 ev), the percentage (X) of germanium that is required to reduce the energy gap by 120 meV is calculated as follows:

$$1.15(1-X)+0.82(X)=1.15-0.120.$$

Solving this equation reveals that 36% germanium is required to effect the necessary energy gap reduction. In a 0.5 micron junction, there are about $2.5 \times 10^{18}$ atoms of silicon/cm$^2$. A 36% dose would be approximately $9 \times 10^{17}$ ions/cm$^2$.

If tin is implanted rather than germanium, a smaller dose would be required because of its lower energy gap. In the broadest aspects of the invention, ions of any material having an energy gap lower than that of the silicon (or other substrate material) can be implanted to achieve the desired energy gap reduction. However, on a practical basis, the ions which are implanted should have a size which is compatible with the lattice of the material into which they are implanted, so as to avoid any lattice mismatch. Also, the ions should be capable of being uniformly distributed within the substrate material. For these reasons, germanium and tin are the most preferred for implanting in silicon substrates.

The foregoing discussion of the invention has been made with reference to the modification of the energy gap of the source regions, since they are more likely to contribute the carriers that lead to latch-up of the CMOS circuit. However, it will be appreciated that under appropriate biasing conditions the drain regions can perform the same function. Accordingly, in the preferred embodiment of the invention the energy gap of both the source and drain regions of the complementary MOS transistors are reduced. If the modifying ions are to be implanted uniformly in both the source and drain regions, the implant can be made immediately prior to the masking and doping of the source and drain regions. Alternatively, if it is preferred to have different implants for the sources and drains, or different implants for the n-sources than for the p-sources, the implanting can be done either immediately before or immediately after the source and drain implants, using the same masking for both implants.

It will be appreciated that the energy gap modification technique of the present invention involves very little variation of the CMOS fabrication process. Since the implantation of the modifying ions can be carried out with the same masks that are used during the doping of the source and drain regions, no additional masking steps are required.

Furthermore, the modification of the energy gap for the source and/or drain regions should have very little effect upon the operation of the transistors. Essentially, conduction in a MOS transistor is a function of the doping under the gate between the source and drain regions, and is not determined by the energy gap of the source region. Thus, the threshold voltage for turning the transistor on should not be disturbed by the present invention.

It will be appreciated by those of ordinary skill in the art that the present invention can be embodied in other specific forms without the departing from the spirit or essential characteristics thereof. The presently disclosed embodiment is therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. In a CMOS integrated circuit comprising complementary NMOS and PMOS transistors formed on a substrate, a method for reducing the tendency of the circuit to latch comprising the step of implanting ions into the source region of each of the NMOS and PMOS transistors, said ions being of a material having an energy gap which is lower than the energy gap of the material forming the substrate.

2. The method of claim 1 wherein ions of said lower energy gap material are also implanted into the drain regions of said NMOS and PMOS transistors.

3. The method of claim 1 wherein the substrate is made of silicon and said lower energy gap material is germanium.

4. The method of claim 1 wherein the substrate is made of silicon and said lower energy gap material is tin.

5. In a CMOS integrated circuit comprising a substrate of one conductivity, a source and a drain each of a conductivity opposite to said one conductivity formed in said substrate, a well of said opposite conductivity formed in said substrate and a source and a drain of said one conductivity formed in said well, a method for reducing the tendency of the circuit to latch up comprising the steps of modifying the energy gap of one of said substrate and said source of said opposite conductivity so that the energy gap of said source is less than that of said substrate, and modifying the energy gap of one of said well and said source of said one conductivity so that the energy gap of said source is less than that of said well.

6. The method of claim 5 wherein said modifying steps comprise implanting said sources with ions of a material having a lower energy gap than the material forming said substrate and said well.

* * * * *